United States Patent
Cloutier et al.

(10) Patent No.: US 11,125,795 B2
(45) Date of Patent: Sep. 21, 2021

(54) CAPACITIVE SENSOR

(71) Applicant: VIBROSYSTM INC., Longueuil (CA)

(72) Inventors: Marius Cloutier, Longueuil (CA);
Mathieu Cloutier, Richelieu (CA)

(73) Assignee: VIBROSYSTM INC., Longueuil (CA)

( * ) Notice: Subject to any disclaimer, the term of this patent is extended or adjusted under 35 U.S.C. 154(b) by 82 days.

(21) Appl. No.: 16/568,795

(22) Filed: Sep. 12, 2019

(65) Prior Publication Data
US 2020/0088774 A1    Mar. 19, 2020

Related U.S. Application Data

(60) Provisional application No. 62/751,785, filed on Oct. 29, 2018, provisional application No. 62/732,247, filed on Sep. 17, 2018.

(51) Int. Cl.
| | |
|---|---|
| *G01R 27/26* | (2006.01) |
| *G01N 27/22* | (2006.01) |
| *G01D 5/24* | (2006.01) |

(52) U.S. Cl.
CPC ....... *G01R 27/2605* (2013.01); *G01N 27/221* (2013.01); *G01D 5/24* (2013.01)

(58) Field of Classification Search
None
See application file for complete search history.

(56) References Cited

U.S. PATENT DOCUMENTS

| | | | | |
|---|---|---|---|---|
| 6,001,239 A | * | 12/1999 | Douglas | C12Q 1/001 204/403.11 |
| 2006/0042966 A1 | * | 3/2006 | Hariu | G01N 27/07 205/787.5 |
| 2011/0215821 A1 | * | 9/2011 | Pavan | G01R 27/26 324/686 |
| 2018/0045667 A1 | * | 2/2018 | Huang | G01N 27/327 |
| 2019/0011320 A1 | * | 1/2019 | Pappalardo | G01M 5/0083 |

* cited by examiner

*Primary Examiner* — Jas A Sanghera
(74) *Attorney, Agent, or Firm* — Norton Rose Fulbright Canada LLP; Alexandre Daoust

(57) ABSTRACT

The capacitive sensor can have a sensing body having two flat conductor elements positioned parallel to one another and held spaced apart from one another, and having a thickness normal to the flat conductor elements, the sensing body having at least one aperture formed across its thickness. The capacitive sensor can be used to measure an air gap between a stator and rotor of a rotary electric machine, and the presence of the apertures can facilitate ventilation and/or improve linearization process of capacitive sensor through redistribution of its current vs distance signal along the measuring range, thus potentially increasing signal to noise ratio where it is the challenging to do so.

16 Claims, 9 Drawing Sheets

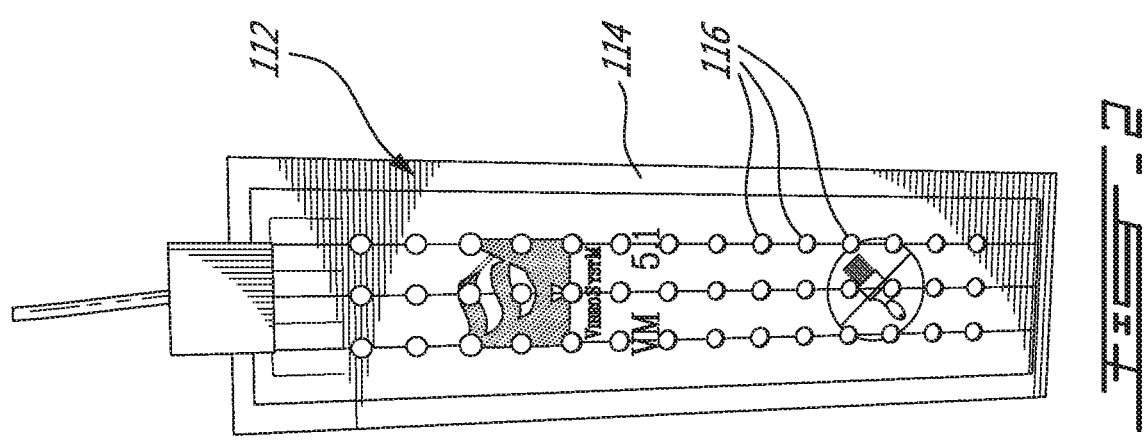

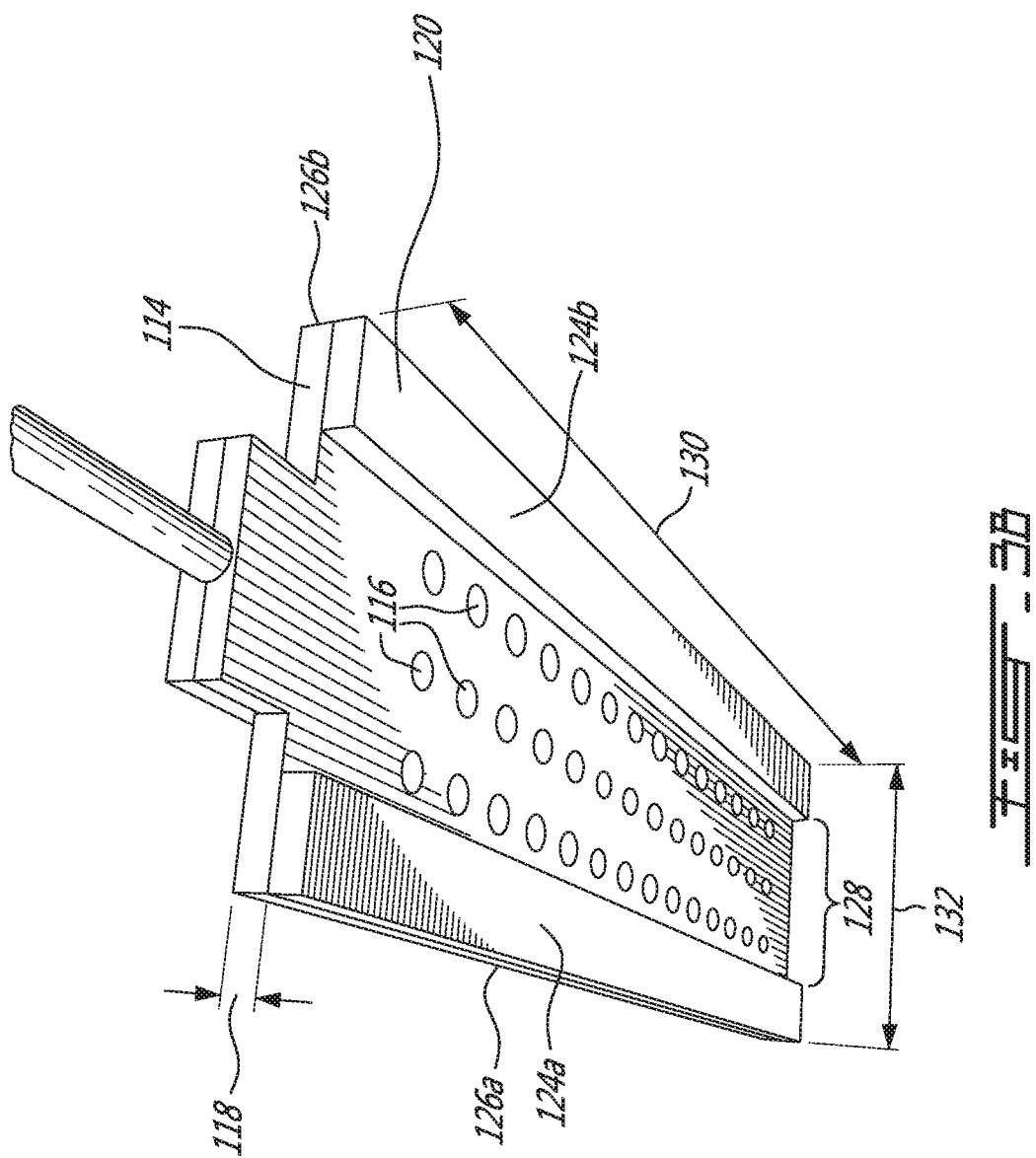

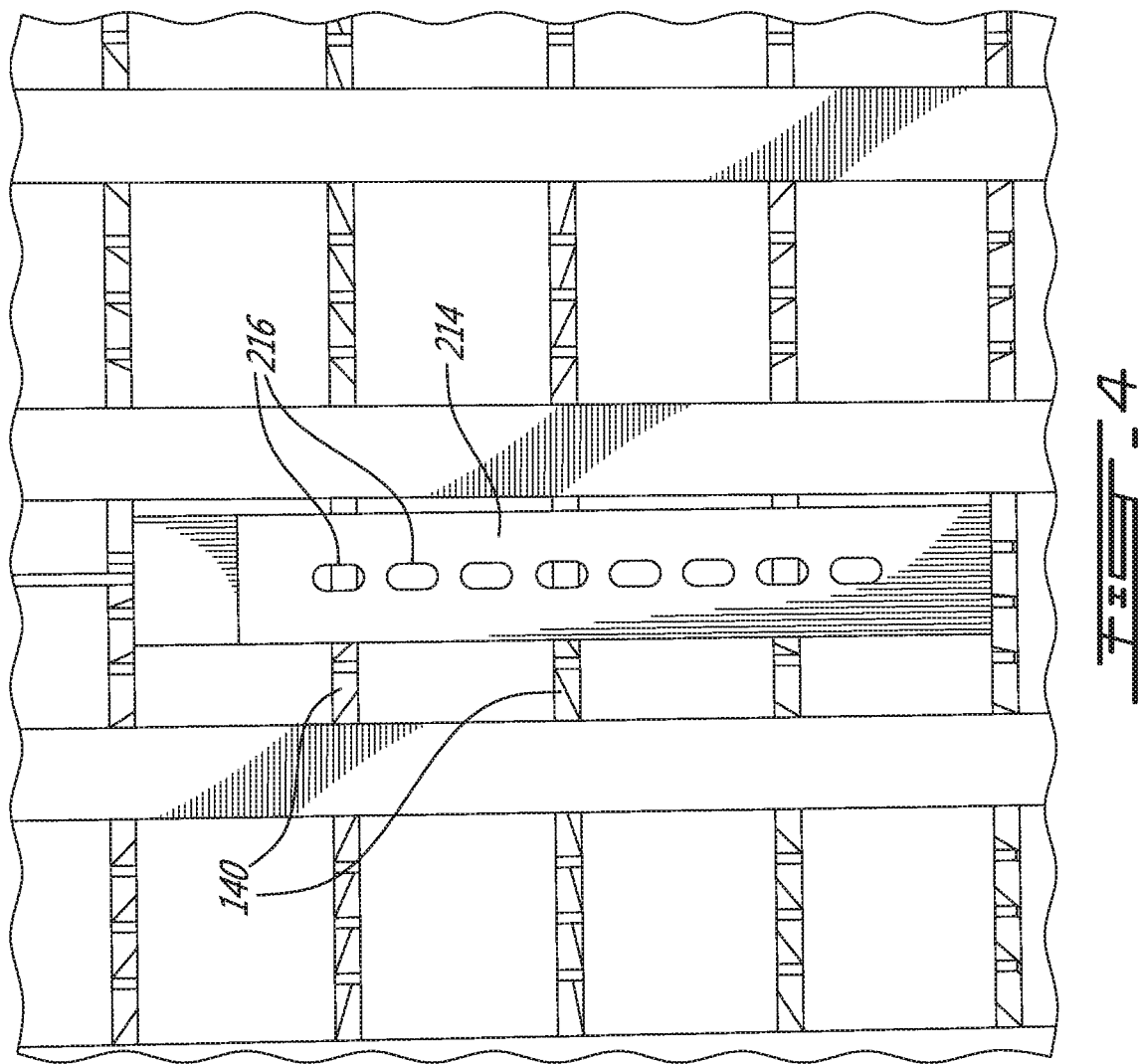

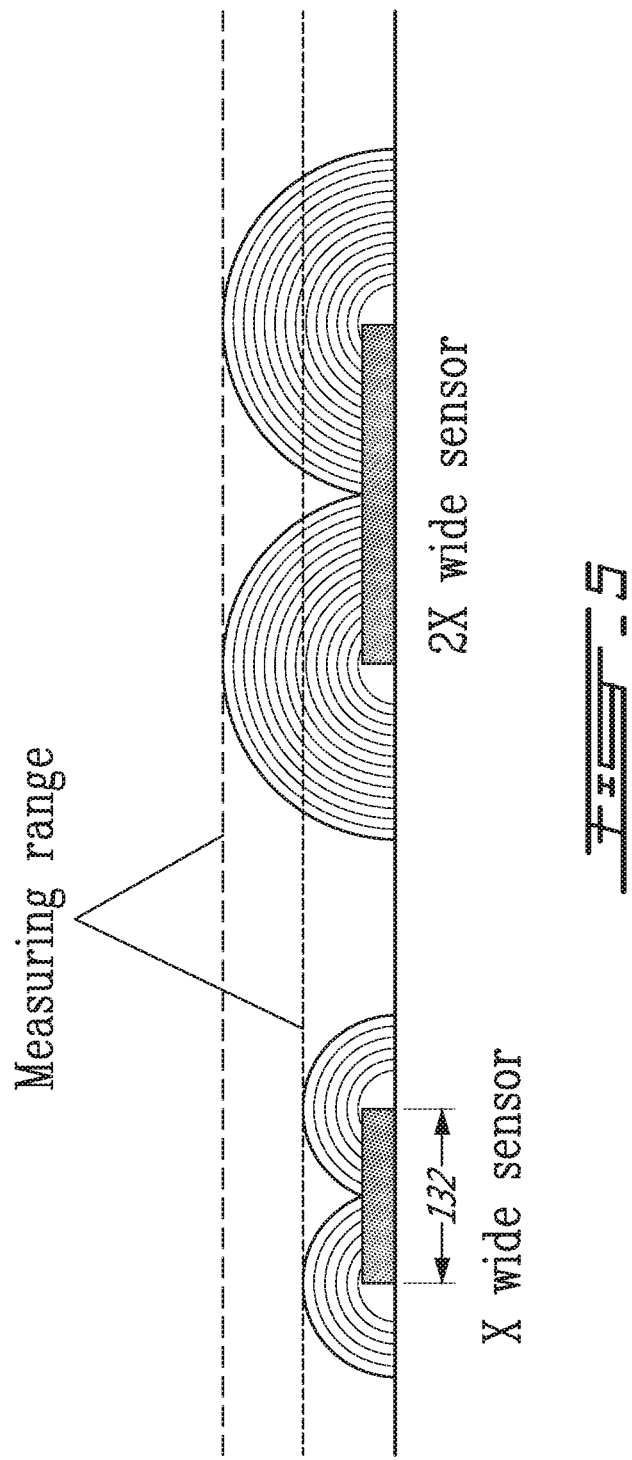

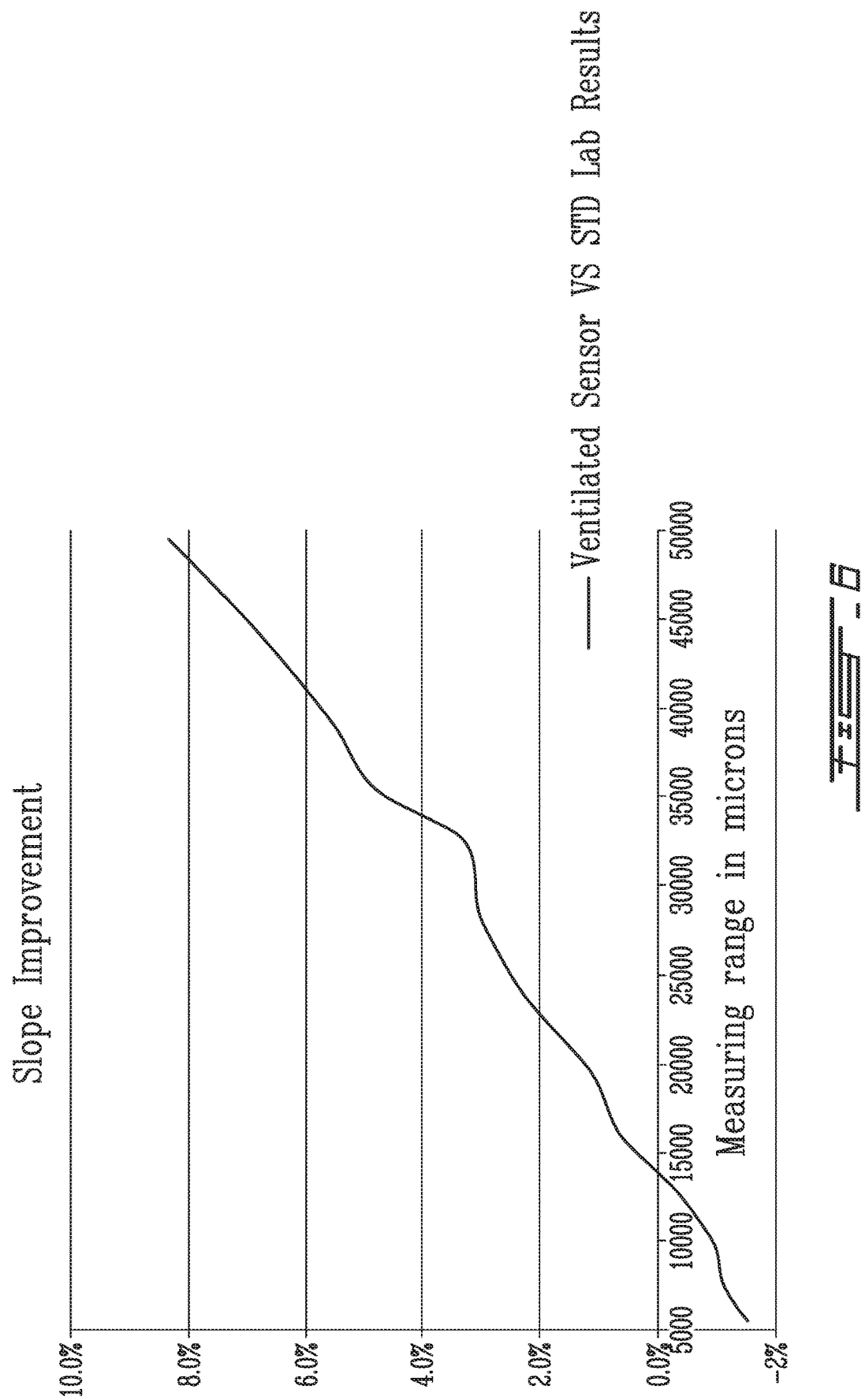

CAPACITIVE SENSOR

BACKGROUND

Capacitive sensors, sometimes referred to as dielectric sensors, use capacitance to measure the dielectric permittivity of a surrounding medium. An oscillating electrical field can be generated between conductive elements of a sensing body, and changes in dielectric constant of surrounding media can be detected by changes in the operating frequency. Capacitive sensors are used in a wide variety of applications, including clearance monitoring in rotating machines. In practice, capacitive sensors commonly in use today have multiple superimposed insulated and semi conductive layers.

In some applications, the available space to position the sensing body is limited. In some electric rotating machines, for instance, it can be desired to monitor the space, commonly referred to as an "air gap", between the stator and the rotor. Accordingly, many electric rotating machines operating nowadays have their stator equipped with one or more capacitive sensors. An example of an electric rotating machine, more specifically a salient pole electric machine, is shown on FIG. 1A. The capacitive sensors 12 are affixed on the stator surface 14 facing the rotor 16, and constantly monitor the air gap between the rotor 16 and stator 14 while the machine is operating, and can alternately be referred to as "air gap sensors" in this context.

In such applications, the radial spacing between the rotor 16 and the stator 14 can be limited, and it can be desired to use a capacitive sensor having a plate-like, flat, thin, sensing body to fit into the limited space. Such capacitive sensors may have a circular or rectangular shape, and can be planar or slightly curved. As an example, the VM 5.1 capacitive sensor 12 manufactured by VibroSystM™, shown in FIG. 1B, is a planar rectangular capacitive sensor having 80×300×4 mm.

In rotating machine applications, the electronic hardware 20, including the oscillator (sometimes referred to as the high frequency generator) and other acquisition equipment, can be positioned remotely from the rotating machine, to protect the electronic hardware 20 from the harsh environment of the machine, and can thus be connected to the capacitive sensor 12 by a cable 22. The distance between the electronic hardware 20 and the rotating machine 10 can be referred to as the remoteness distance, or removal distance 24. It can be desired to increase the remoteness distance 24, but since the length of the cable can also affect electromagnetic accuracy, a compromise must often be reached between remoteness distance 24 and cable length.

While such capacitive sensors 12 were satisfactory in many applications, there remained room for improvement.

SUMMARY

Some rotating electrical machines (e.g. generators or motors) have ventilation systems which circulate cooling gas (including air) through core slots in the stator. In the case of hydro-generators, such slots are radially oriented, located on the internal face of the stator, and may number in the several thousands. A typical rectangular half-section may be around 6×30 mm.

It will be understood that positioning a sensing body on an inner surface of a stator having such ventilation slots may locally affect the efficiency of the ventilation. For instance, a capacitive sensor 12 such as the VM 5.1 may obstruct as many as 5 of the ventilation slots referred to above, and there may be as many as 24 sensors installed on the stator core of a given machine. While the efficiency of the ventilation may remain within allowable tolerances, any hindrance to ventilation remains undesired, and it can therefore be desired to minimise the effect caused by the capacitive sensing process on the ventilation process.

Reducing the capacitive sensor's sensing area can reduce the impact of the presence of the sensor on ventilation, but simultaneously affects the sensor's signal to noise ratio, thereby directly affecting measuring range and/or available cable length. This effect is schematized in FIG. 5. Accordingly, there remained room for improvement.

It has been unexpectedly and surprisingly found that forming apertures across the thickness of a sensing body of a capacitive sensor could allow not only to reduce the hindrance to ventilation caused by its presence by allowing ventilation through the apertures, and this without excessive impact on its signal to noise ratio, but could even go so far as to improve the signal to noise ratio towards the greater end of its measuring distance range. Such an apertured sensor, which can hereafter be referred to as a ventilated sensor, can thus be designed and fabricated so as to increase its measuring range and/or increase the remoteness distance of its electronic hardware from the vicinity of the machine, independently of whether the effect of minimizing any obstruction to the cooling gas flow to the stator is desired or not in the context of the specific application.

In accordance with one aspect, there is provided a capacitive sensor having a laminar sensing body having multiple superimposed insulated and semi conductive layers positioned parallel to one another and held spaced apart from one another, and having a thickness normal to the flat conductor elements, the sensing body having at least one aperture formed across its thickness.

In accordance with another aspect, there is provided an electric machine having a stator, a rotor, an air gap between the inner surface of the stator and the rotor, a flat capacitive sensing body secured to an inner face of the stator, the flat capacitive sensing body having a plurality of apertures formed across its thickness.

Many further features and combinations thereof concerning the present improvements will appear to those skilled in the art following a reading of the instant disclosure.

DESCRIPTION OF THE FIGURES

In the figures,

FIG. 2 is a top plan view of a capacitive sensor in accordance with a first embodiment;

FIG. 3B is an oblique view of the capacitive sensor of FIG. 3A shown alone and taken from an opposite side, showing a spacer in the form of transversal ridges creating a ventilation channel under the sensor;

FIG. 4 is a top plan view showing a capacitive sensor mounted to an inner surface of a stator, in accordance with a third embodiment, the capacitive sensor having elongated holes increasing the probability of their superposition with ventilation slots on the stator for a sensor designed to measure relatively small air gaps;

FIG. 5 is a cross sectional view showing capacitive sensors having different surface areas, and schematizing the difference of measuring range between different surface areas: given the fact that a stronger electric field can be generated by the sensor having the larger width, and since the voltage measured and the distance measured can be linearly linked, a sensor having its width doubled (i.e. its surface doubled) can have twice the measuring range;

FIG. 6 is a graph showing an example of slope improvement percentage (before linearization) for increasing airgap widths for a "ventilated" (apertured) sensor vs. a sensor without the apertures but otherwise identical and used in the same measuring conditions;

DETAILED DESCRIPTION

FIG. 2 provides an example of a capacitive sensor 112 including a sensing body 114. The sensing body is relatively thin and planar, and is a laminar structure composed of an alternating superposition of electrically conductive layers and electrically insulating layers. The electrically conductive layers are made of semi-conductive materials, and the sensing body 114, in this example, generally corresponds to the VM 5.1 model capacitive sensor, in which an array of apertures 116, have been made across the thickness 118 of the sensing body 114 (the thickness being generally normal to the page showing FIG. 2, and being best seen in FIG. 3A).

Figure 1A:
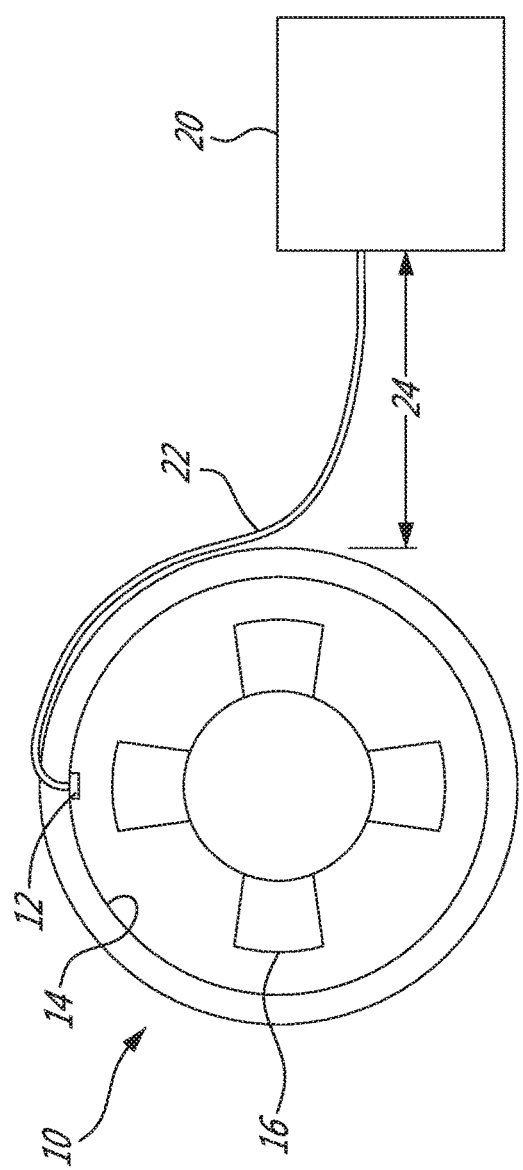
FIG. 1A shows an example of a capacitive sensor mounted on an inner face of a stator of a rotary electric machine, with the electronic hardware being located remotely from the electric machine and connected to the capacitive sensor via a cable, in accordance with the prior art.
Figure 1B:
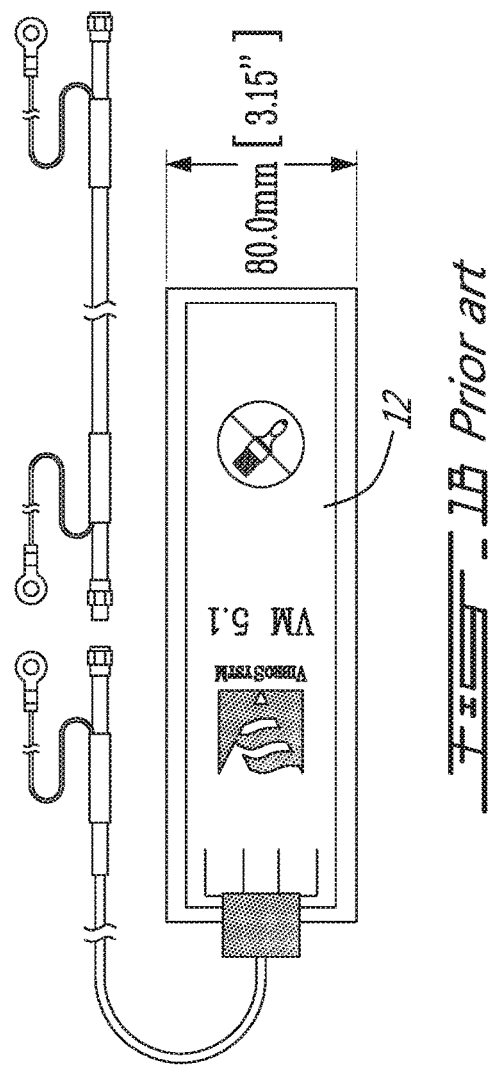
FIG. 1B shows an example of a capacitive sensor in accordance with the prior art.
Figure 3A:
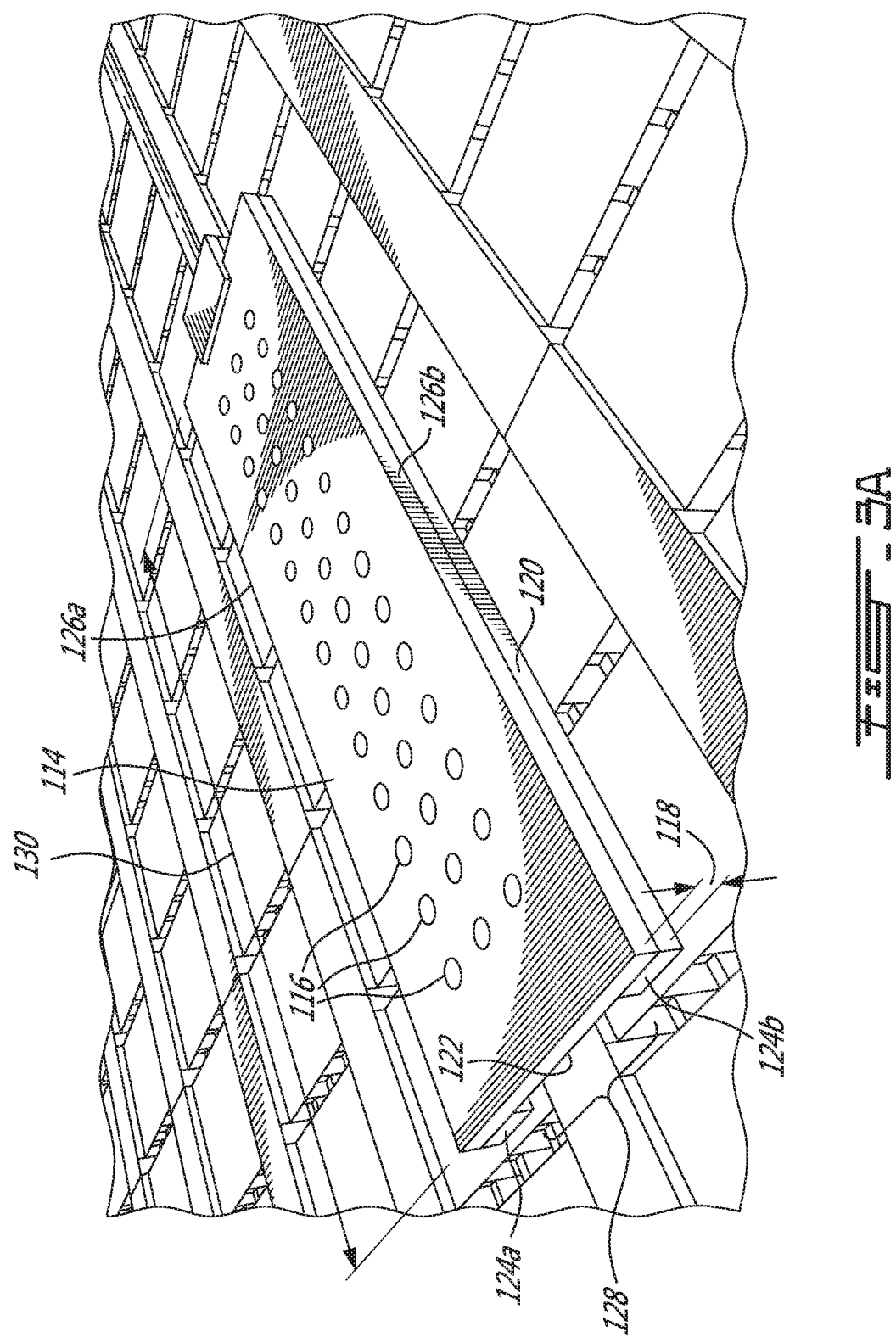
FIG. 3A is an oblique view showing a capacitive sensor mounted to an inner surface of a stator, in accordance with a second embodiment.
Figure 7:
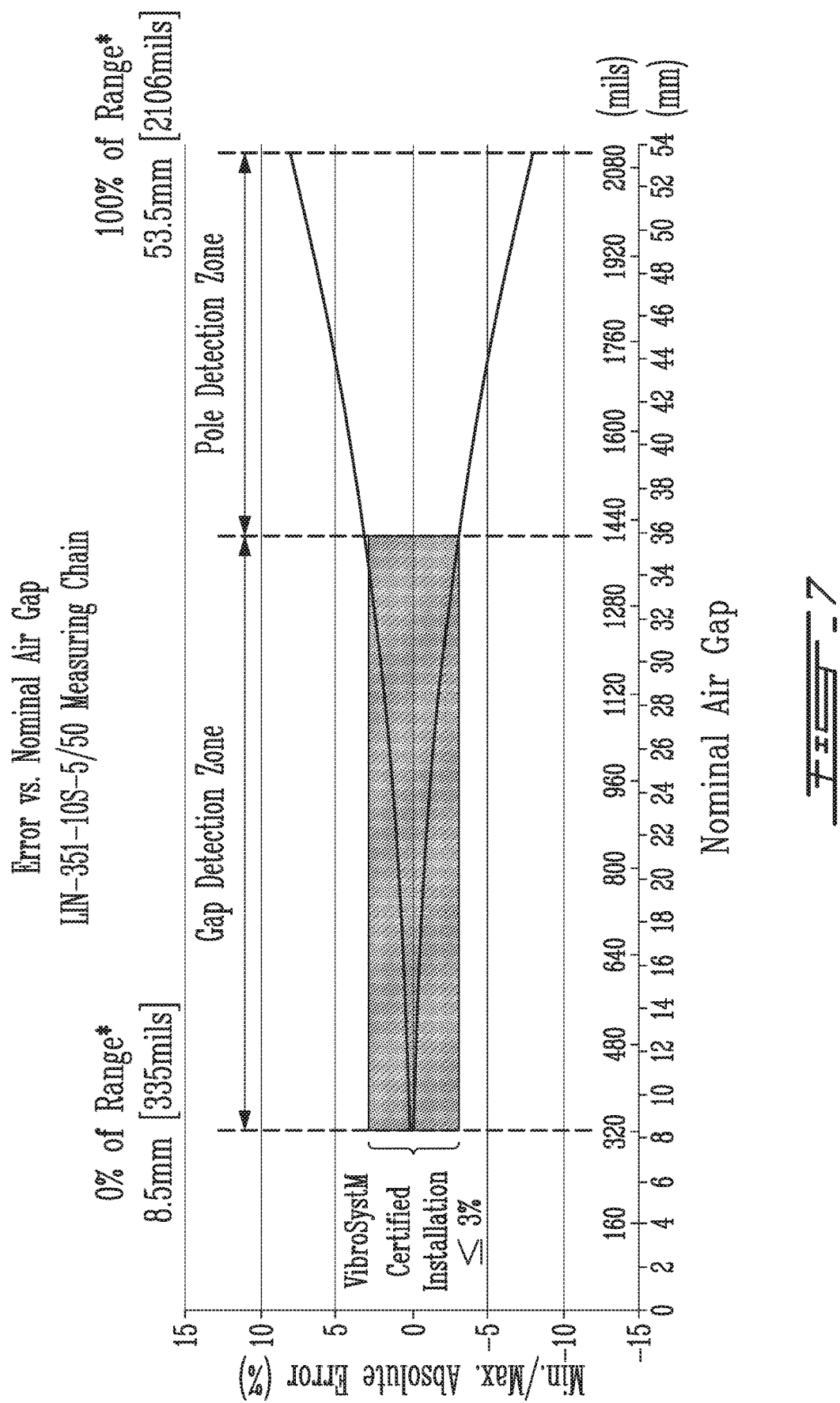
FIG. 7 is a graph showing how signal to noise ratio can be affected by the size of the air gap to be measured, for a given flat capacitive sensor.
Figure 8:
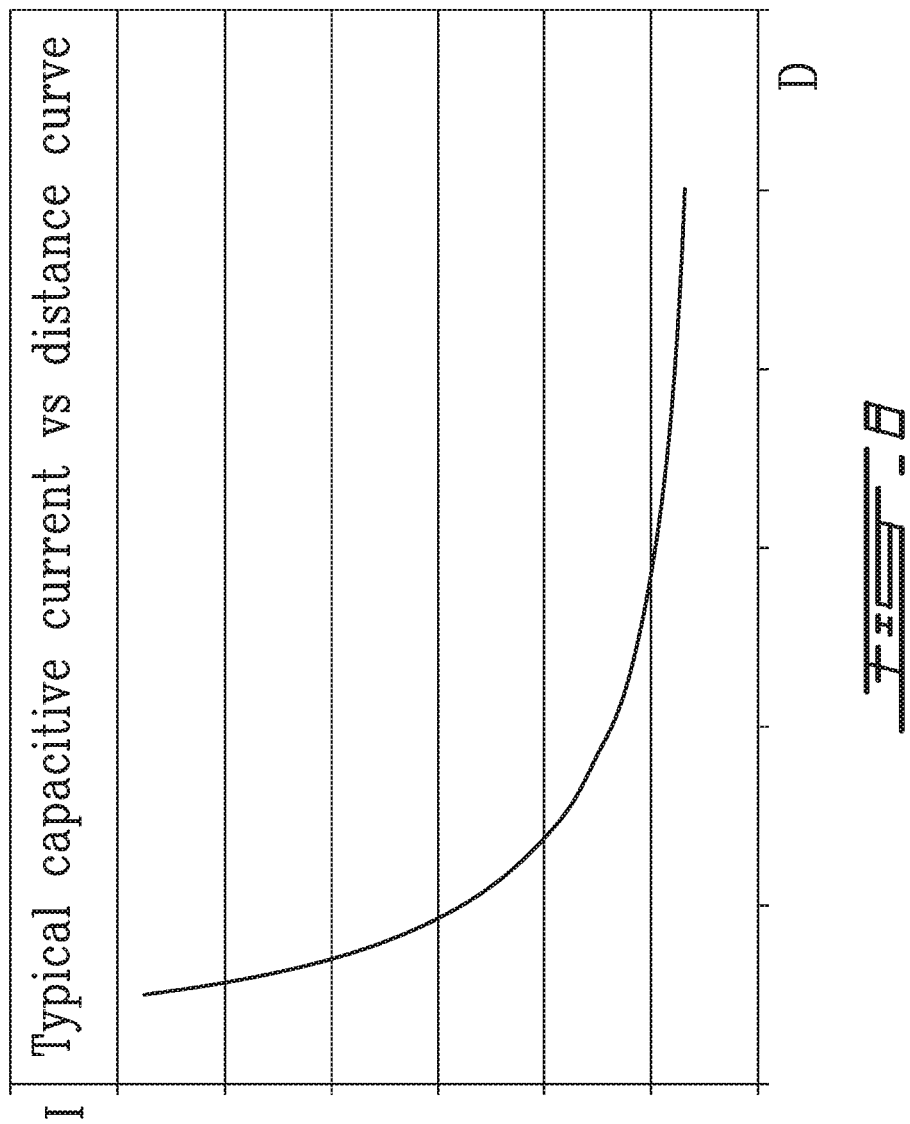
FIG. 8 is a graph schematizing a typical relationship between capacitive current and distance.

More generally, a conventionally fabricated rectangular capacitive air gap sensor can be modified as follows:

a) the conventional capacitive sensor can have several layers glued together. Straight transversal holes, circular, obround, or having any suitable other shape, can be pierced through those layers. It can be preferred to increase the surface area of the apertures to a certain extent, but in some embodiments, it can be preferred, on the other hand, to limit the surface area of the apertures in a manner to limit the effect the presence of the apertures can have on rigidity, and limit stochastic uncertainty in the measurement of the air gap which could otherwise be introduced. In the case of the VM 5.1 model capacitive sensor, for instance, the diameter of such holes may be up to around 6.35 mm (0.250") and the number of such holes may be of around 42, for instance, as shown in FIG. 2. The surface of the apertures was selected to represent a total of 8% of the sensor's area in this example.

b) In addition to those holes, and in applications where ventilation capability is desired, a ventilation gap may be created between the surface of the stator facing the sensor and the surface of the sensor facing the stator. This can be achieved using a spacer 120 on one face 122 of the sensing body 114, for instance. In the embodiment shown in FIG. 3B, for instance, the spacer 120 includes two elongated spacing members 124a, 124b aligned with opposite edges 126a, 126b of the sensing body 114, with a spacing 128 between the spacing members 124a, 124b forming a ventilation channel along the entire length 130 of the sensing body 114. Accordingly, even if the transversal apertures 116 pierced across the thickness 118 of the sensing body 114 do not coincide and superimpose with stator ventilation slots, gas flow may still access the stator ventilation slots, such as shown in FIG. 3A. However, in situations where the air gap to be monitored is so small that such a spacer would add too much thickness to the sensing body, the apertures 216 the sensor body 214 may be of an elongated, e.g. obround, cross-sectional shape along the plane of the sensor body 214 so as to increase the probability of their superposition on the stator ventilation slots 140, such as shown in FIG. 4 c) The measuring range of the capacitive sensor depends on its width 132, as schematized in FIG. 5. Reducing the width 132 to limit the ventilation slots obstruction decreases the airgap sensor's measuring range. Indeed, experience tells us that certain amplitude of signal received by the sensor is also required in order to obtain an acceptable signal to noise ratio. One way to improve the signal to noise ratio is to increase the sensor measuring surface. Once the sensor width 132 is established based on the needed measuring range, the proper signal to noise ratio can be obtained by defining the sensor length 130. Since these constraints condition the size of the sensor for a corresponding application, the option of decreasing the size of the sensor to limit the stator ventilation slots obstruction may not be satisfactory in some applications.

d) the electronics that measure and interpret the high frequency capacitive current variations resulting from the electric field generated by said sensor across the air gap can be modified and recalibrated to the new capacitive surface.

Repeated simulations, laboratory experiments and measurements have been performed to compare signal to noise ratios of capacitive sensors having unapertured flat sensing bodies with capacitive sensors of the same model but in which a limited surface area of apertures have been defined, tested in the same conditions. This work indicated that apertured sensors were slightly disadvantaged when used in the smaller distance portion of their measuring range (i.e. used to measure smaller air-gaps), although this disadvantage was considered minor and perfectly acceptable in many embodiments. However, this work also indicated that the apertured sensors were increasingly advantaged as distances to be measured increase. This relationship is plotted in FIG. 6, as an example, for the unapertured and apertured versions of the VM 5.1 sensor presented above, thereby potentially offering a significant advantage for a relatively minor disadvantage. Accordingly, for applications in harsh environments (such as in the mining industry) where the cable length between the sensor and the conditioner is limited by the signal to noise ratio, and where there is a motivation to position electronics as far away as possible from the machine to be monitored, such cable length may be increased, perhaps even doubled by using a capacitive sensor with greater surface, but this is at the cost of increasing the stator ventilation system obstruction. Accordingly, using an apertured capacitive sensor may be preferred as it may lead to comparable advantages at a lower cost of ventilation system obstruction.

As can be understood, the examples described above and illustrated are intended to be exemplary only. The scope is indicated by the appended claims.

What is claimed is:

1. A capacitive sensor having a sensing body having at least two layers of electrically conductive material positioned parallel to one another and electrically insulating media between the at least two electrically conductive layers, the sensing body having a thickness normal to the electrically conductive layers, the sensing body having at least one aperture formed across its thickness and allowing fluid flow circulation therethrough, the capacitive sensor having a measuring range extending in a same orientation as the thickness, outside the thickness.

2. The capactive sensor of claim 1 comprising a plurality of apertures formed across the thickness of the sensing body.

3. The capacitive sensor of claim 2 wherein the apertures are regularly interspaced from one another.

4. The capacitive sensor of claim 1 wherein a spacer is provided on a face of the sensing body configured to be secured to an inner surface of a stator of an electric machine, the spacer having at least one ventilation channel formed along the face of the sensing body, the at least one ventilation channel communicating with said at least one aperture.

5. The capacitive sensor of claim 1 wherein the sensing body includes at least three of said layers of electrically conductive material interspaced from one another by a corresponding plurality of layers of electrically insulating material, the layers of electrically conductive material and the layers of electrically insulating material being superimposed to one another and forming a laminar structure.

6. The capacitive sensor of claim 5 wherein the electrically conductive material is a semi-conductor.

7. The capacitive sensor of claim 1 wherein the sensing body is planar.

8. The capacitive sensor of claim 1 wherein the sensing body is rectangular in shape, comprising a plurality of said at least one aperture arranged in a rectangular array fitting the rectangular shape of the sensing body.

9. The capacitive sensor of claim 1 wherein the at least one aperture has a circular cross-section relative to an axis normal to the at least two layers.

10. The capacitive sensor of claim 1 wherein the at least one aperture has an obround cross-section relative to an axis normal to the at least two layers, wherein a length of the obround cross-section is in the same orientation as a length of the sensing body.

11. A method of measuring an air gap between a stator and a rotor of an electric machine using a capacitive sensor positioned within the air gap, the capacitive sensor having a sensing body having at least two layers of electrically conductive material positioned parallel to one another and electrically insulating media between the at least two electrically conductive layers, the sensing body having a thickness normal to the electrically conductive layers, parallel to an orientation of the air gap, the sensing body having at least one aperture formed across its thickness and allowing fluid flow circulation therethrough, the method comprising measuring the air gap based on a change of oscillator resonance frequency stemming from a change of capacitance in the vicinity of the capacitive sensor, the change of capacitance in the vicinity of the capacitive sensor stemming from a change in the air gap, further comprising achieving better linearization and signal-to-noise ratio as the measuring range increases, at a greater distance end of the measuring range, than what would be achieved if a capacitive sensor without said at least one aperture but otherwise the same was used in the same measuring conditions.

12. The method of claim 11 further comprising achieving worse linearization and signal-to-noise ratio at a lower distance end of the measuring range.

13. An electric machine having a stator, a rotor, an air gap between the inner surface of the stator and the rotor, a capacitive sensing body having a thickness extending between two opposite faces, the capacitive sensing body secured to the inner surface of the stator, the capacitive sensing body having a plurality of apertures formed across its thickness, electronic equipment positioned remotely from the electric machine and connected to the capacitive sensing body by a cable, the electronic equipment configured to detect changes of capacitance in the vicinity of the capacitive sensor stemming from a change in the air gap.

14. The electric machine of claim 13 having a plurality of ventilation slots formed in an inner surface of the stator.

15. The electric machine of claim 13 wherein a spacer is provided between the capacitive sensing body and the inner surface of the stator, the spacer having at least one ventilation channel formed therein, the ventilation channel extending across an entire length of the flat capacitive sensing body.

16. The electric machine of claim 13 further comprising an oscillator formed with the capacitive sensing body, and being configured to detect changes of capacitance via changes in the resonance frequency of the oscillator.

* * * * *